(12) United States Patent
Kawahashi et al.

(10) Patent No.: US 6,509,610 B2
(45) Date of Patent: Jan. 21, 2003

(54) INSULATED GATE SEMICONDUCTOR DEVICE WITH HIGH MINORITY CARRIER INJECTION AND LOW ON-VOLTAGE BY ENLARGED PN-JUNCTION AREA

(75) Inventors: Akira Kawahashi, Komaki (JP); Katsuhiko Nishiwaki, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 09/906,825

(22) Filed: Jul. 18, 2001

(65) Prior Publication Data

US 2002/0013030 A1 Jan. 31, 2002

(30) Foreign Application Priority Data

Jul. 28, 2000 (JP) ........................................ 2000-228872

(51) Int. Cl.[7] ...................... H01L 21/336; H01L 29/078
(52) U.S. Cl. ........................ 257/330; 438/259; 438/271
(58) Field of Search .................. 257/330, 267, 257/328, 329, 331, 334, 339, 341, 342, 332, 244, 284, 314, 409, 374

(56) References Cited

U.S. PATENT DOCUMENTS 6,291,298 B1 * 9/2001 Williams et al. ............ 438/270

FOREIGN PATENT DOCUMENTS

| JP | 406177389 A | * 6/1994 |
| JP | A 8-222728 | 8/1996 |
| JP | A 10-50724 | 2/1998 |

* cited by examiner

*Primary Examiner*—Olik Chaudhurl
*Assistant Examiner*—Dana Farahani
(74) *Attorney, Agent, or Firm*—Oliff & Berridge, PLC

(57) ABSTRACT

A semiconductor device is formed such that a contact surface between a p-type high-concentration semiconductor region and an n-type high-concentration buffer region assumes a convexo-concave shape. This makes it possible to enlarge an area of the contact surface between the p-type high-concentration semiconductor region and the n-type high-concentration buffer region. As a result, holes are injected into an n-type low-concentration drift region from the p-type high-concentration semiconductor region with higher efficiency and with a less voltage drop between the pn-junction. Thus, effects of conductivity modulation can be achieved sufficiently and the on-resistance and the voltage drop of an IGBT can be lowered.

14 Claims, 8 Drawing Sheets

INSULATED GATE SEMICONDUCTOR DEVICE WITH HIGH MINORITY CARRIER INJECTION AND LOW ON-VOLTAGE BY ENLARGED PN-JUNCTION AREA

INCORPORATION BY REFERENCE

The disclosure of Japanese Patent Application No. 2000-228872 filed on Jul. 28, 2000 including the specification, drawings and abstract is incorporated herein by reference in its entirety.

BACKGROUND OF THE INVENTION

1. Field of the Invention

The invention relates to a semiconductor device and a method of manufacturing a semiconductor device and, more particularly, to a semiconductor device comprising a first conductive-type semiconductor region made from a first conductive-type semiconductor material into which carriers are injected from a channel formed of a gate electrode and a second conductive-type semiconductor region made from a second conductive-type semiconductor material and formed in such a manner as to contact the first conductive-type semiconductor region, and to a method of manufacturing such a semiconductor device.

2. Description of Related Art

As a semiconductor device of this type, there has been proposed a trench-gate-type IGBT (insulated gate bipolar transistor) with a channel formed of a gate electrode formed in a trench (see Japanese Patent Application Laid-Open No. HEI 8-222728). In a trench-gate-type IGBT, since a channel is formed longitudinally along a trench, electrons can be sufficiently injected into a substrate from the channel.

In such a trench-gate-type IGBT, however, even if gate electrodes are arranged at intervals of a reduced distance to increase the amount of electrons injected from channels, effects of conductivity modulation deteriorate and the on-resistance is increased unless a sufficient amount of holes are supplied from a diode formed in a pn-junction portion on the collector side. Particularly, when the ambient temperature is very low, effects of conductivity modulation deteriorate and the operating temperature range of the IGBT is narrowed unless a sufficient amount of holes are supplied from the diode on the collector side.

SUMMARY OF THE INVENTION

A semiconductor device according to the invention aims at enhancing carrier injection efficiency and thus the overall performance. A method of manufacturing a semiconductor device according to the invention aims at manufacturing a semiconductor device with high carrier injection efficiency.

A semiconductor device according to a first aspect of the invention is a trench-gate-type semiconductor device comprising a first conductive-type semiconductor region made from a first conductive-type semiconductor material into which carriers are injected from a channel formed of a gate electrode formed in a trench and a second conductive-type semiconductor region made from a second conductive-type semiconductor material and formed in such a manner as to contact the first conductive-type semiconductor region. A contact surface between the first and second conductive-type semiconductor regions is formed in a convexo-concave shape.

In the first aspect of the invention, the contact surface between the first and second conductive-type semiconductor regions is formed in a convexo-concave shape. Thus, the area of the contact surface between the first and second conductive-type semiconductor regions can be enlarged, and the efficiency of injecting carriers into the first conductive-type semiconductor region from the second conductive-type semiconductor region can be enhanced with a correspondingly less voltage drop between the pn-junction regions. As a result, the performance of the semiconductor device can be improved.

A semiconductor device according to a second aspect of the invention is a semiconductor device comprising a first conductive-type semiconductor region made from a first conductive-type semiconductor material into which carriers are injected from a channel formed of a gate electrode and a second conductive-type semiconductor region made from a second conductive-type semiconductor material and formed in such a manner as to contact the first conductive-type semiconductor region. An average interface of a contact surface between the first and second conductive-type semiconductor regions is formed in such a manner as to form a predetermined angle with the channel. The contact surface is formed in a convexo-concave shape.

In the second aspect of the invention, the average interface of the contact surface between the first and second conductive-type semiconductor regions is formed in such a manner as to form a predetermined angle with the channel, and the contact surface between the first and second conductive-type semiconductor regions is formed in a convexo-concave shape. Thus, the area of the contact surface between one of the first and second conductive-type semiconductor regions and the other conductive-type semiconductor region can be enlarged, and the efficiency of injecting carriers into the first conductive-type semiconductor region from the second conductive-type semiconductor region can be enhanced. As a result, the performance of the semiconductor device can be improved.

In the first or second aspect of the invention, the contact surface may be at least partially formed as a curved surface. Thus, the area of the contact surface between the first and second conductive-type semiconductor areas can further be enlarged, resulting in a less voltage drop between the pn-junction regions for the same amount of injection of holes.

In the first or second aspect of the invention, the first conductive-type semiconductor regions may have a high-concentration impurity layer demonstrating a high concentration of impurities and a low-concentration impurity layer formed on the high-concentration impurity layer and demonstrating a low concentration of impurities. With this structure, the voltage blocking capability of the semiconductor device can be increased. In this structure, portions of the second conductive-type semiconductor region projecting into the first conductive-type semiconductor region may be formed in such a manner as to contact either the high-concentration impurity layer or the high-concentration and low-concentration impurity layers.

In a method of manufacturing a semiconductor device according to a third aspect of the invention, a trench-gate-type semiconductor device comprising a first conductive-type semiconductor region made from a first conductive-type semiconductor material in which carriers are injected from a channel formed of a gate electrode formed in a trench and a second conductive-type semiconductor region made from a second conductive-type semiconductor material and formed in such a manner as to, contact the first conductive-type semiconductor region is manufactured. This method comprises a semiconductor region forming process in which the first conductive-type semiconductor region and/or the second conductive-type semiconductor region are/is formed such that a contact surface between the first and second conductive-type semiconductor regions assumes a convexo-concave shape.

In the third aspect of the invention, a semiconductor device wherein the contact surface between the first and second conductive-type semiconductor regions assumes a convexo-concave shape, i.e., a semiconductor device wherein the contact surface between the first and second conductive-type semiconductor regions has a large area and wherein carriers are injected into one of the first and second conductive-type semiconductor regions from the other conductive-type semiconductor region with high efficiency can be manufactured.

In the third aspect of the invention, the semiconductor region forming process may include an impurity implantation process in which impurities are selectively implanted in the second conductive-type semiconductor region and a diffusion process in which the first conductive-type semiconductor region is formed in such a manner as to contact the second conductive-type semiconductor region and the impurities are diffused into the first conductive-type semiconductor region. Alternatively, the semiconductor region forming process may include a groove forming process in which grooves are formed in the second conductive-type semiconductor region and a process in which the first conductive-type semiconductor region is formed in such a manner as to contact the second conductive-type semiconductor region. Thus, the contact surface between the first and second conductive-type semiconductor regions can be formed in a convexo-concave shape.

In the third aspect of the invention, the semiconductor region forming process may include a process in which the first conductive-type semiconductor region is formed and a process in which impurities in the second conductive-type semiconductor region are diffused into the first conductive-type semiconductor region to form the second conductive-type semiconductor region. Thus, the thickness of the second conductive-type semiconductor region can further be reduced, and resistance of the second conductive-type semiconductor region can be lowered.

DETAILED DESCRIPTION OF PREFERRED EMBODIMENTS

Figure 1:
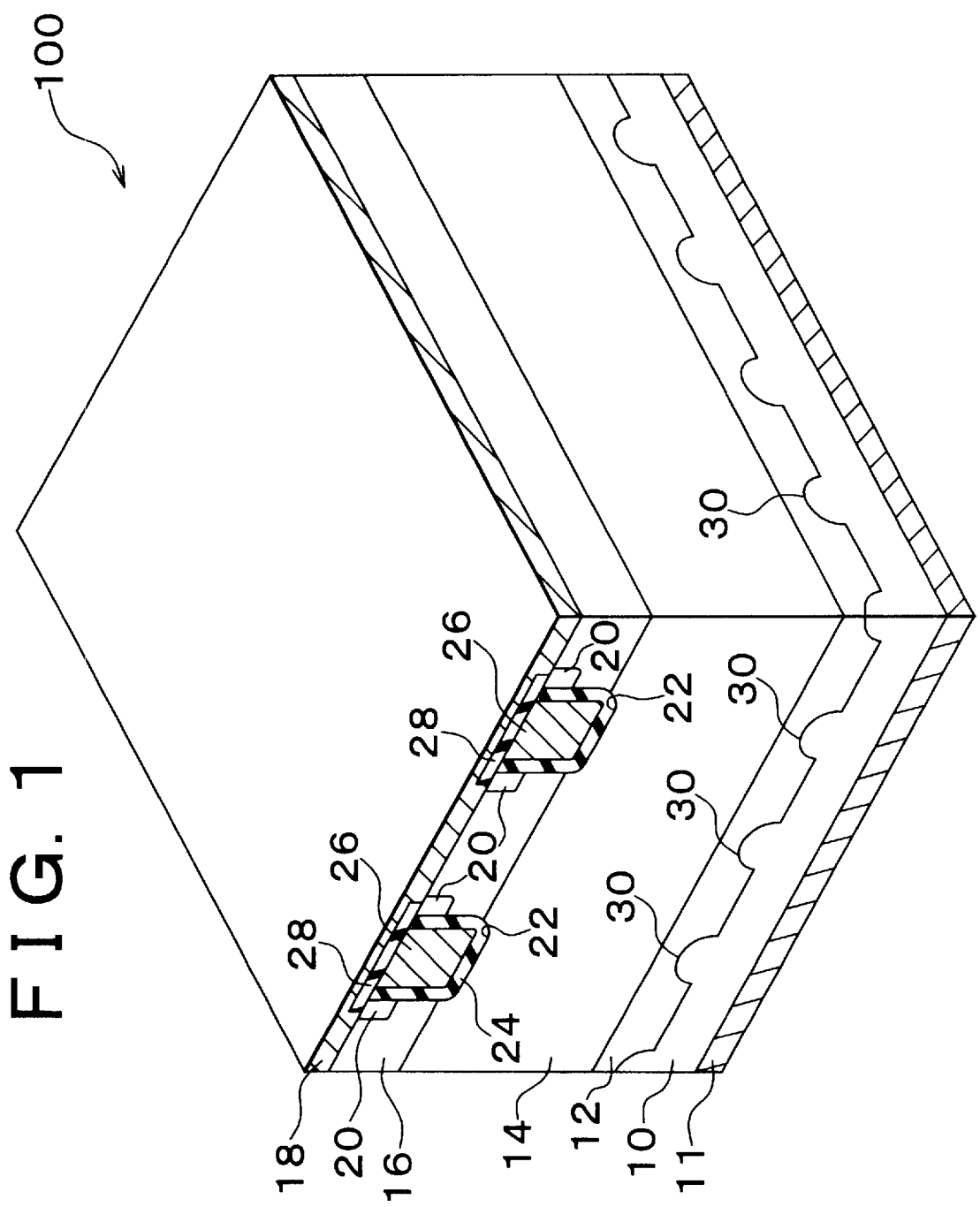
FIG. 1 is a perspective view showing an overall structure of an IGBT 100 according to one embodiment of the invention.

Next, an embodiment of the invention will be described. FIG. 1 is a perspective view showing an overall structure of an IGBT 100 according to one embodiment of the invention. A collector electrode 11 is formed on an entire lower surface of the IGBT 100. The IGBT 100 has a p-type high-concentration semiconductor substrate 10 made from a p-type semiconductor material, an n-type high-concentration buffer region 12 made from an n-type semiconductor material with a high concentration of impurities, an n-type low-concentration drift region 14 made from an n-type semiconductor material with a low concentration of impurities, and a p-type body region 16 made from a p-type semiconductor. A selectively formed n-type emitter region 20 made from an n-type semiconductor material and electrically connected with an emitter electrode 18, a trench 22 penetrating the p-type body region 16 and reaching the n-type low-concentration drift region 14, a gate insulation film 24 made from a silicon oxide and formed on an inner wall of the trench 22, an embedded gate electrode 26 made from polysilicon and formed on the gate insulation film 24, and a cap insulation film 28 insulating the embedded gate electrode 26 from the emitter electrode 18 are formed inside the p-type body region 16. A contact surface between the p-type high-concentration semiconductor substrate 10 and the n-type high-concentration buffer region 12 is formed in a convexo-concave shape. Convex portions 30 of the contact surface hemispherically project into the n-type high-concentration buffer region 12.

Next, operation of the thus-constructed IGBT 100 of the embodiment will be described. If a voltage is impressed between the embedded gate electrode 26 and the n-type emitter region 20, a channel is formed in a portion of the p-type body region 16 extending along the gate insulation film 24, i.e., in the longitudinal direction in FIG. 1. Electrons are injected into the n-type low-concentration drift region 14 from the channel, so that the IGBT 100 is turned on. At this moment, since holes are injected into the n-type low-concentration drift region 14 from the p-type high-concentration semiconductor substrate 10 via the n-type high-concentration buffer region 12 in response to injection of the electrons, conductivity modulation occurs and causes a decrease in on-resistance of the IGBT 100.

In the IGBT 100 of the embodiment, since the contact surface between the p-type high-concentration semiconductor substrate 10 and the n-type high-concentration buffer region 12 is formed in a convexo-concave shape, the area of a pn-junction surface of a diode formed of the p-type high-concentration semiconductor substrate 10 and the n-type high-concentration buffer region 12 is enlarged. Thus, minority carriers can be supplied to the n-type low-concentration drift region 14 sufficiently. As a result, the effect of conductivity modulation can be achieved sufficiently and the on-resistance of the semiconductor device can be reduced. Further, since the pn-junction surface of the diode formed of the p-type high-concentration semiconductor substrate 10 and the n-type high-concentration buffer region 12 has a large area, minority carriers can be supplied to the n-type low-concentration drift region 14 sufficiently even at a low ambient temperature. Therefore, the operating temperature range of the IGBT 100 can be widened.

Figure 2:
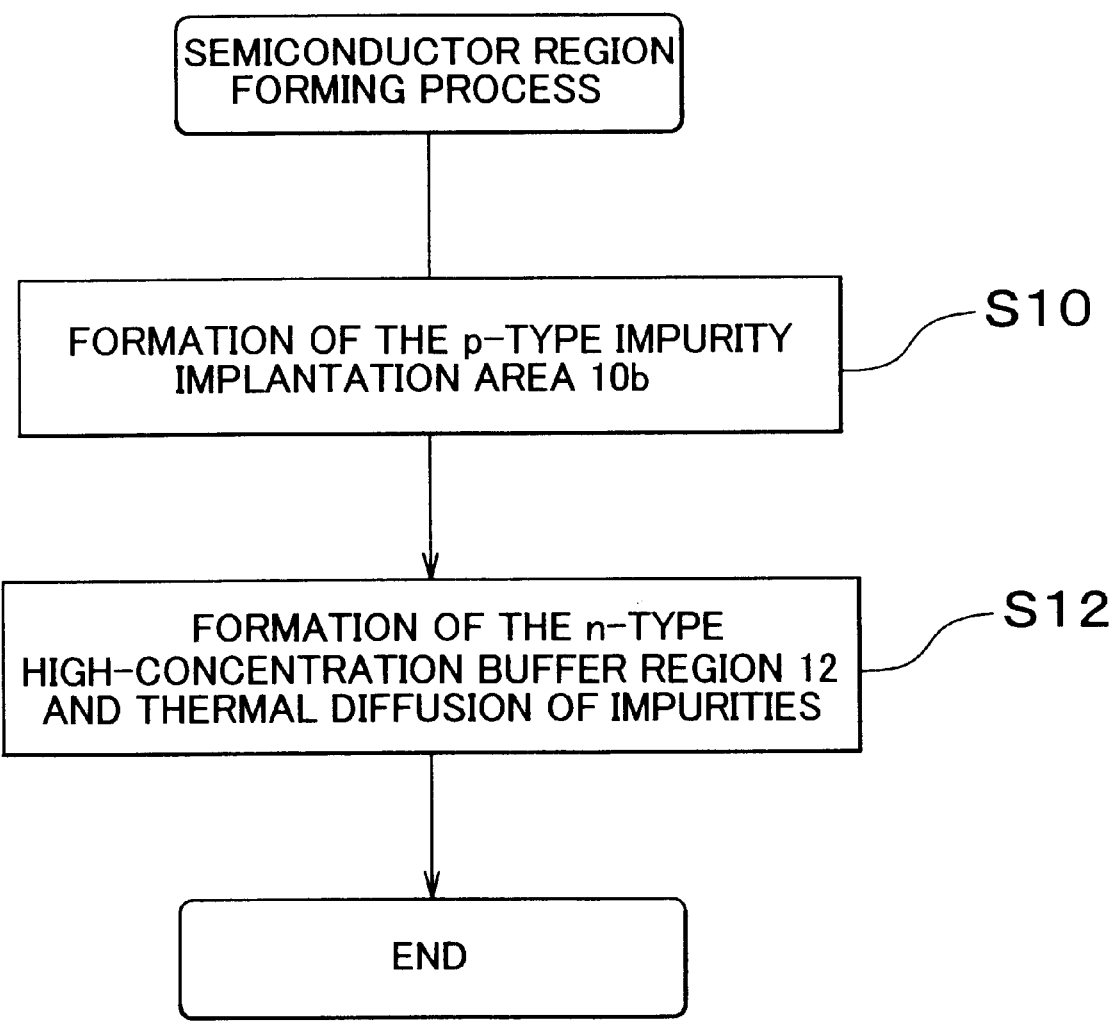
FIG. 2 is a manufacturing process-flow chart showing process of forming semiconductor regions.
Figure 3:
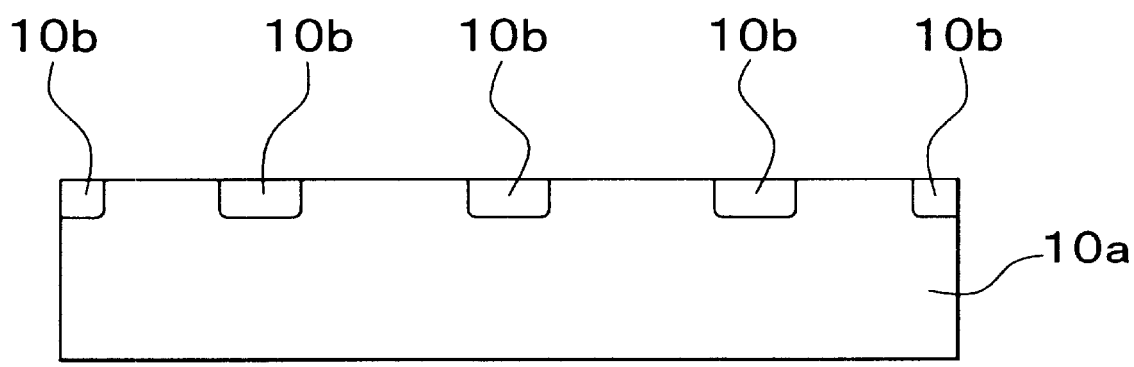
FIG. 3 is a cross-sectional view of the IGBT 100 in a process S10.
Figure 4:
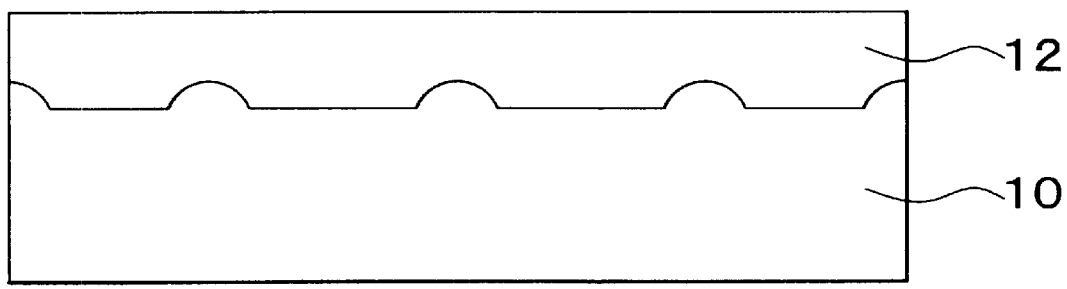
FIG. 4 is a cross-sectional view of the IGBT 100 in a process S12.

Next, processes of forming semiconductor regions, i.e., the p-type high-concentration semiconductor substrate 10 and the n-type high-concentration buffer region 12 as a method of manufacturing the IGBT 100 of this embodiment will be described. FIG. 2 is a manufacturing process-flow chart showing processes of forming semiconductor areas. Each of FIGS. 3, 4 is a cross-sectional view of the IGBT 100 in a certain one of the processes of forming semiconductor regions. In the processes of forming semiconductor regions, first of all, impurities such as boron (B) are implanted in the p-type high-concentration semiconductor substrate 10a by means of ion implantation to form a p-type impurity implantation area 10b (process S10, FIG. 3). At this moment, if the impurities in the p-type high-concentration semiconductor substrate 10a demonstrate a concentration of e.g. about $10^{18}$ cm$^{-3}$, impurities are implanted in the p-type impurity implantation area 10b such that the impurities demonstrate a concentration of about $10^{20}$ cm$^{-3}$. The n-type high-concentration buffer region 12 with impurities of a concentration of $10^{17}$ cm$^{-3}$ is then formed by epitaxial growth. With heat generated at this moment, boron in the p-type impurity implantation area 10b is thermally diffused into the n-type high-concentration buffer region 12 and the p-type high-concentration semiconductor substrate 10a so that the contact surface between the p-type high-concentration semiconductor substrate 10 and the n-type high-concentration buffer region 12 assumes a convexo-concave shape (process S12, FIG. 4). After the processes of forming the semiconductor regions have been finished, other semiconductor regions including the n-type low-concentration drift region 14 and the p-type body region 16, electrodes, and so on are formed to complete the IGBT 100.

According to the method of manufacturing the IGBT 100 of this embodiment as described above, the contact surface between the p-type high-concentration semiconductor substrate 10 and the n-type high-concentration buffer region 12 can be formed in a convexo-concave shape. Thus, a semiconductor device that has a large-area pn-junction portion of a diode formed of the p-type high-concentration semiconductor substrate 10 and the n-type high-concentration buffer region 12 and that produces effects of conductivity modulation sufficiently, i.e., the IGBT 100 of the embodiment can be manufactured.

Figure 5:
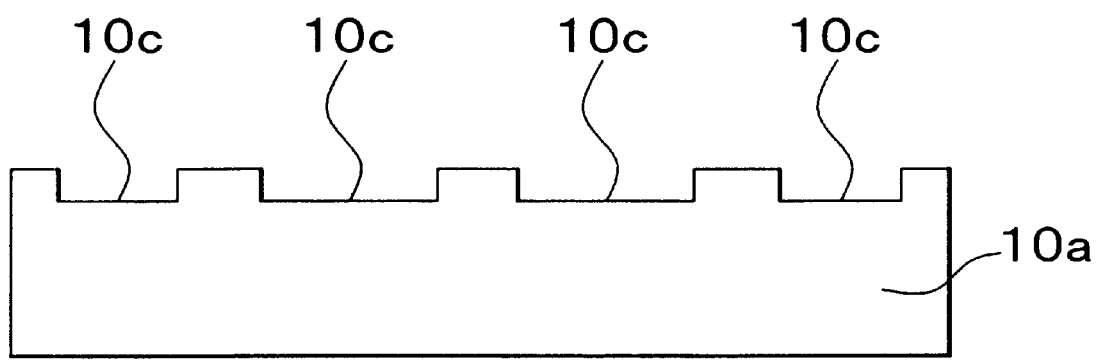
FIG. 5 is a cross-sectional view of the IGBT in a process of forming grooves in a surface of a p-type high-concentration semiconductor substrate 10a, as one of the processes of forming semiconductor regions.
Figure 6:
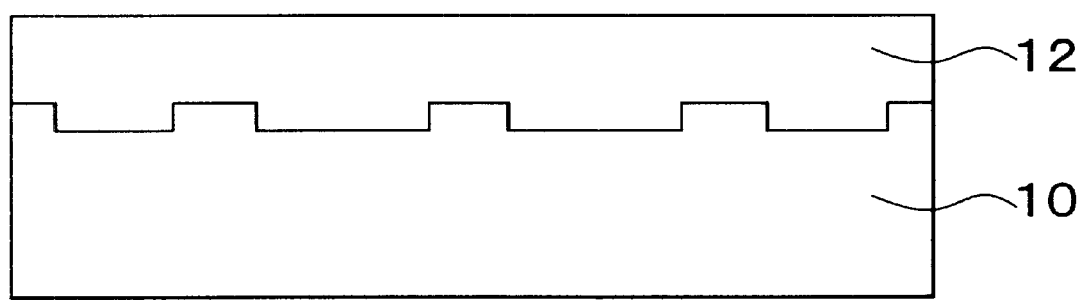
FIG. 6 is a cross-sectional view of the IGBT in a process of forming an n-type high-concentration buffer region 12, as one of the processes of forming semiconductor regions.

Although ion implantation is used in the processes of forming semiconductor regions shown in FIG. 2, a method of forming grooves in the surface of the p-type high-concentration semiconductor substrate 10a may also be adopted. Each of FIGS. 5, 6 is a cross-sectional view of the IGBT in a certain one of the processes of forming semiconductor regions using a method of forming grooves in the surface of the p-type high-concentration semiconductor substrate 10a. First of all, grooves 10c of a predetermined depth are formed in the surface of the p-type high-concentration semiconductor substrate 10a by means of dry etching or the like (FIG. 5). The n-type high-concentration buffer region 12 with impurities of a concentration of $10^{17}$ cm$^{-3}$ is formed by epitaxial growth and flattened by etch back (FIG. 6). This method also makes it possible to form the contact surface between the p-type high-concentration semiconductor substrate 10 and the n-type high-concentration buffer region 12 in a convexo-concave shape.

Although the high-concentration impurity area 10b is formed on the p-type high-concentration semiconductor substrate 10a in the processes of forming semiconductor regions shown in FIG. 2, the p-type high-concentration semiconductor area 10b and the n-type high-concentration buffer region 12 may be formed by thermally diffusing impurities such as boron from the back side of the n-type high-concentration semiconductor substrate. In this method, the thickness of the p-type high-concentration semiconductor substrate 10 can be reduced and the resistance of the p-type high-concentration semiconductor substrate 10 can correspondingly be lowered.

Figure 7:
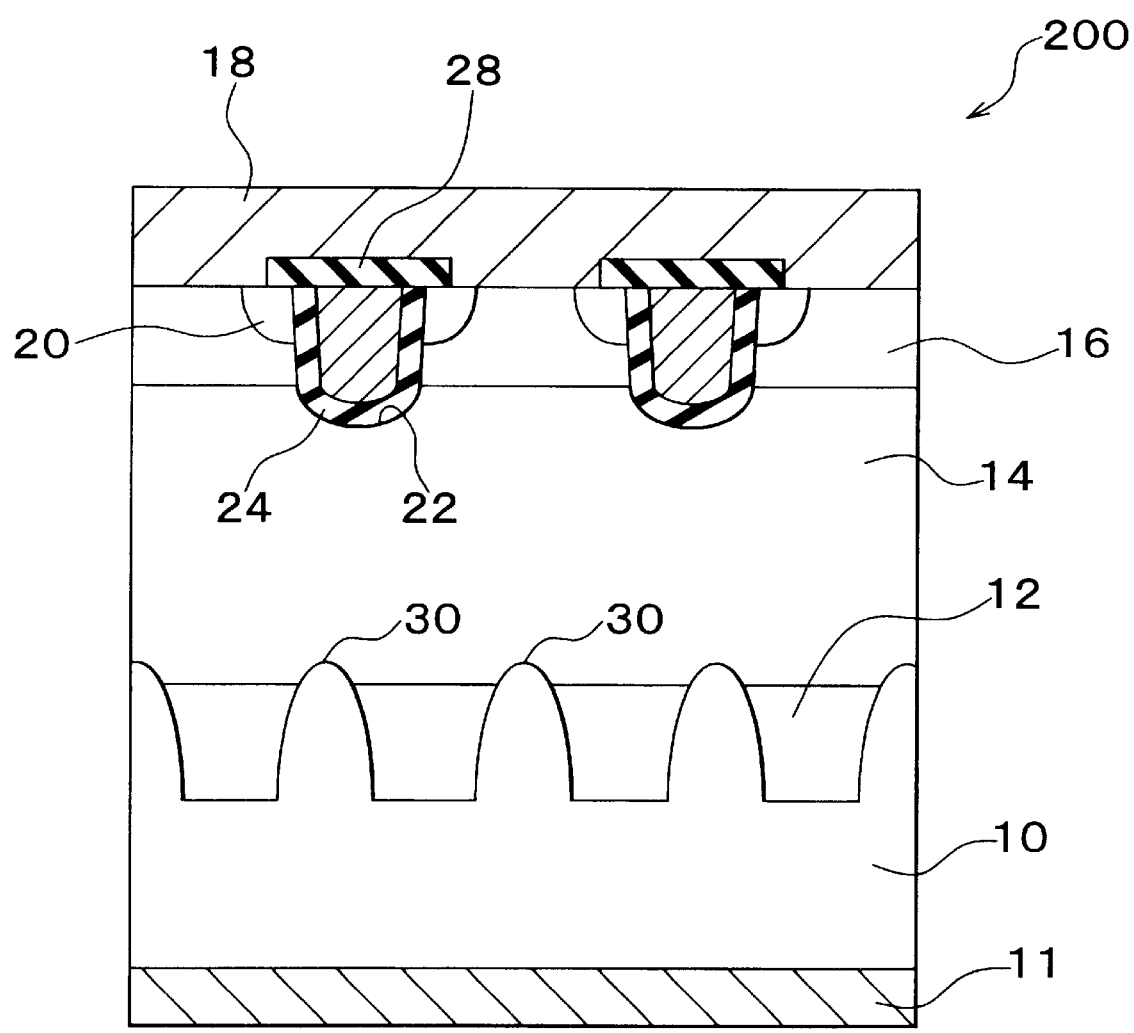
FIG. 7 is a cross-sectional view showing an overall structure of an IGBT 200 according to a variant of the invention.

Although the p-type high-concentration semiconductor substrate 10 is in contact with the n-type high-concentration buffer region 12 in the IGBT 100 of this embodiment, the p-type high-concentration semiconductor substrate 10 may be in contact with the n-type high-concentration buffer region 12 and the n-type low-concentration drift region 14 as is the case with an IGBT 200 of a variant of the invention shown in FIG. 7. The p-type high-concentration semiconductor substrate 10 of the IGBT 200 is formed in such a manner as to penetrate the n-type high-concentration buffer region 12 and reach the n-type low-concentration drift region 14. In this manner, since the p-type high-concentration semiconductor substrate 10 is also in contact with the n-type low-concentration drift region 14, minority carriers can be injected into the n-type low-concentration drift region 14 efficiently. The IGBT 200 of this variant can be manufactured by forming and heating the n-type low-concentration drift region 14 and thermally diffusing impurities implanted in the p-type impurity implantation area 10b into the n-type low-concentration drift region 14 after the processes of forming semiconductor regions shown in FIG. 2 have been finished.

Figure 8:
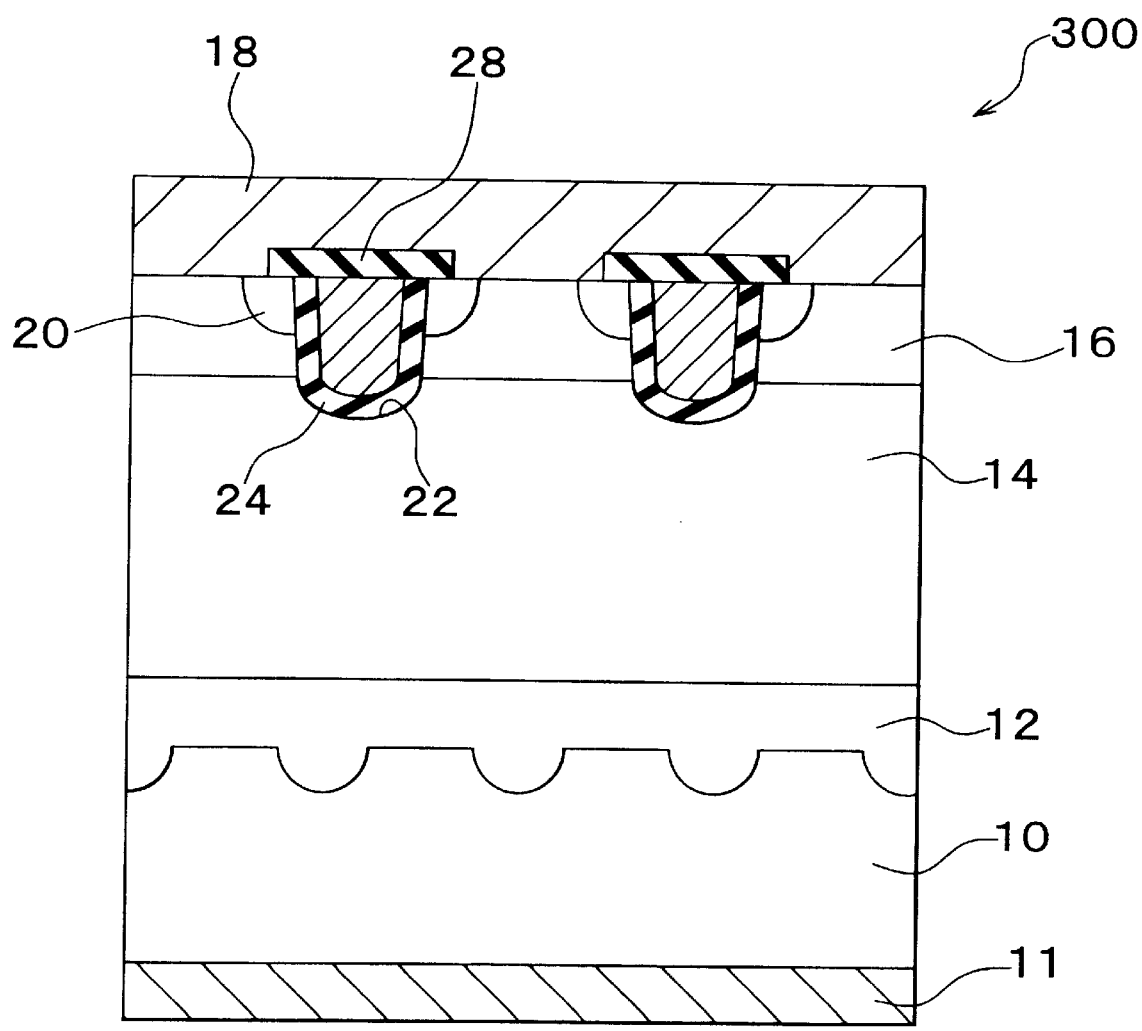
FIG. 8 is a cross-sectional view of an IGBT 300 according to a variant of the invention with the n-type high-concentration buffer region 12 hemispherically projecting into the p-type high-concentration semiconductor substrate 10.
Figure 9:
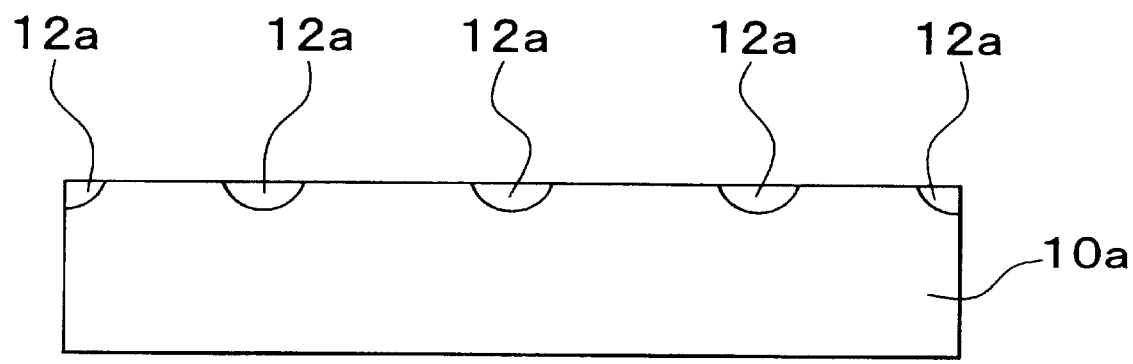
FIG. 9 is a cross-sectional view of the IGBT 300 in a process of forming an n-type high-concentration impurity region 12a, as one of the processes of forming semiconductor regions.
Figure 10:
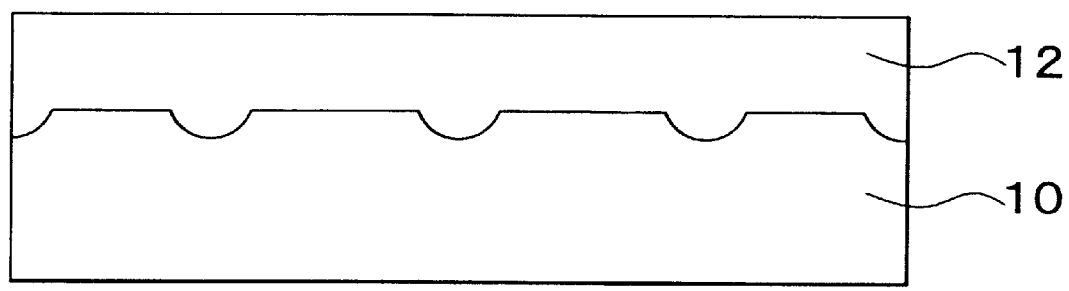
FIG. 10 is a cross-sectional view of the IGBT 300 in a process of forming the n-type high-concentration buffer region 12, as one of the processes of forming semiconductor regions.

Although the convex portions 30 of the contact surface between the p-type high-concentration semiconductor substrate 10 and the n-type high-concentration buffer region 12 are formed such that the p-type high-concentration semiconductor substrate 10 hemispherically projects into the n-type high-concentration buffer region 12 in the IGBT 100 of the embodiment, the n-type high-concentration buffer region 12 may hemispherically project into the p-type high-concentration semiconductor substrate 10 as is the case with an IGBT 300 of a variant of the invention shown in FIG. 8. This also makes it possible to efficiently inject holes into the n-type low-concentration drift region 14 from the p-type high-concentration semiconductor substrate 10. Next, processes of forming semiconductor regions, i.e., the p-type high-concentration semiconductor substrate 10 and the n-type high-concentration buffer region 12 as a method of manufacturing the IGBT 300 of the variant will be described. Each of FIGS. 9, 10 is a cross-sectional view of the IGBT 300 in a certain one of the processes of forming semiconductor regions. First of all, impurities such as phosphor are implanted in the p-type high-concentration semiconductor substrate 10a in an insular or linear shape by means of ion implantation to form the n-type impurity implantation area 12a (FIG. 9). At this moment, if the impurities in the p-type high-concentration semiconductor substrate 10a demonstrate a concentration of e.g. about $10^{18}$ cm$^{-3}$, impurities are implanted in the n-type impurity implantation area 12a such that the impurities demonstrate a concentration of about $10^{20}$ cm$^{-3}$. Further, at this moment, the n-type impurity implantation area 12a can also be formed by means of thermal diffusion. The n-type high-concentration buffer region 12 with impurities of a concentration of $10^{17}$ cm$^{-3}$ is then formed by epitaxial growth. With heat generated at this moment, phosphor in the n-type impurity implantation area 12a is thermally diffused into the n-type high-concentration buffer region 12 and the p-type high-concentration semiconductor substrate 10a so that the contact surface between the p-type high-concentration semiconductor substrate 10 and the n-type high-concentration buffer region 12 assumes a convexo-concave shape (FIG. 10). This method also makes it possible to form the contact surface between the p-type high-concentration semiconductor substrate 10 and the n-type high-concentration buffer region 12 in a convexo-concave shape.

Figure 11:
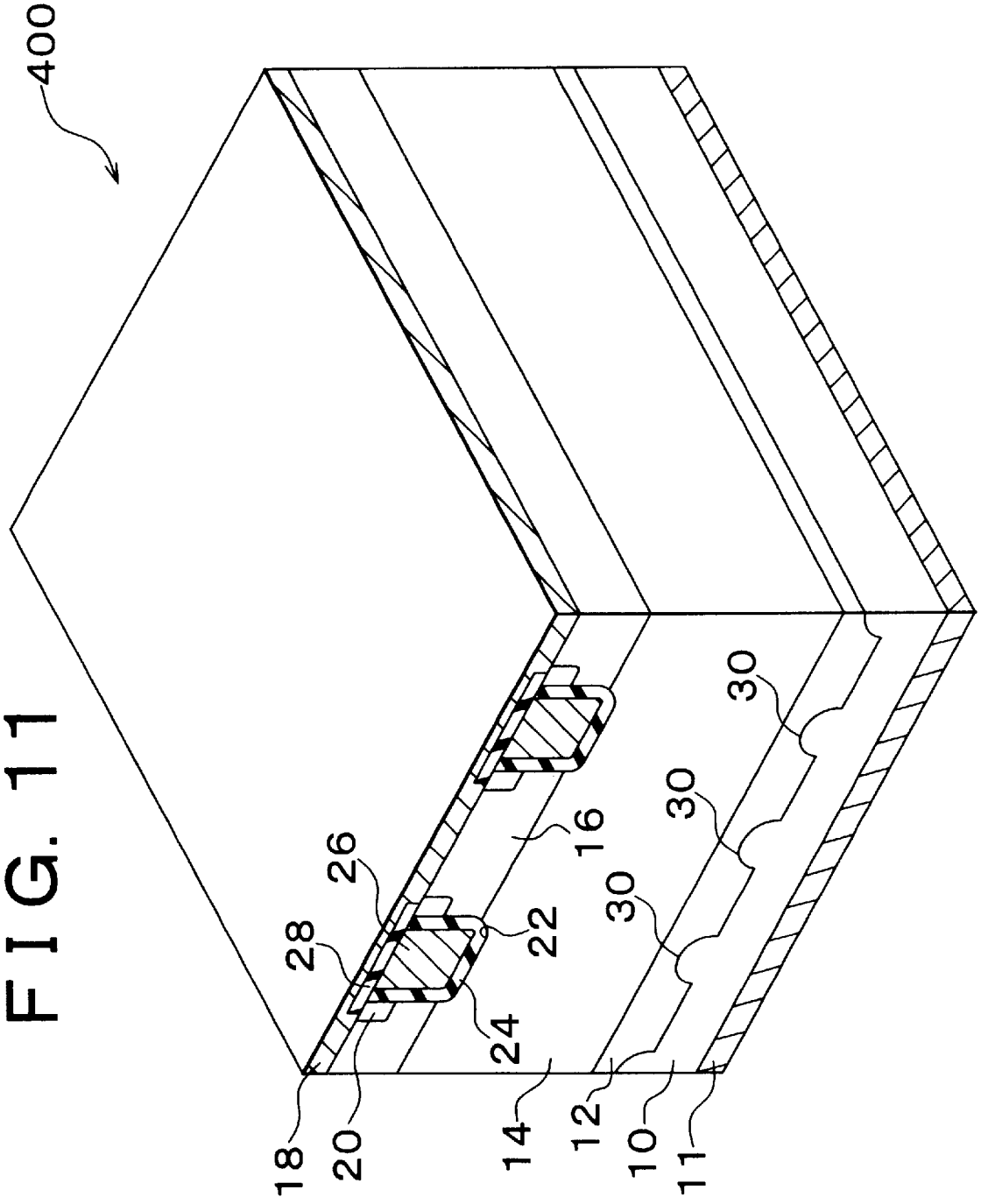
FIG. 11 is a perspective view showing an overall structure of an IGBT 400 according to a variant of the invention with such a configuration that a contact surface between the p-type high-concentration semiconductor substrate 10 and the n-type high-concentration buffer region 12 has convex portions in the shape of a semicircular cylinder.

Although the convex portions 30 of the contact surface between the p-type high-concentration semiconductor substrate 10 and the n-type high-concentration buffer region 12 are formed hemispherically in the IGBT 100 of the embodiment, they may assume other shapes. For instance, the convex portions 30 of the contact surface between the p-type high-concentration semiconductor substrate 10 and the n-type high-concentration buffer region 12 may be formed in the shape of a semicircular cylinder as is the case with an IGBT 400 of a variant of the invention shown in FIG. 11. That is, the contact surface is required only to assume a convexo-concave shape and may be in various shapes including the shape of a semicircular cylinder.

Although the IGBT 100 of the embodiment is provided with the n-type high-concentration buffer region 12, it is also possible to dispense with the n-type high-concentration buffer region 12 and form the contact surface between the p-type high-concentration semiconductor substrate 10 and the n-type low-concentration drift region 14 in a convexo-concave shape.

Although the semiconductor device has been described as an IGBT in each of the embodiment and the variants, the semiconductor device should not be limited to an IGBT. Namely, the semiconductor device may be a GTO (gate turn off) thyristor, i.e., one of such semiconductor devices that operate by being supplied with carriers from a pn-junction portion.

Although the embodiment and the variants of the invention have been described above, it is quite obvious that the invention should not be limited thereto and that various modifications are possible without departing from the gist of the invention. For example, the semiconductor regions may be different in conductivity type from one another.

What is claimed is:

1. A trench-gate-type semiconductor device comprising:
   a first conductive-type semiconductor region having a first surface and a second surface opposite to the first surface, and made from a first conductive-type semiconductor material into which carriers are injected from a channel formed of a gate electrode formed in a trench solely on the first surface;
   a second conductive-type semiconductor region made from a second conductive-type semiconductor material and formed in such a manner as to contact the second surface of the first conductive-type semiconductor region; and
   a convexo-concave portion formed on a contact surface between the first and second conductive-type semiconductor regions.

2. The semiconductor device according to claim 1, wherein the contact surface is at least partially formed as a curved surface.

3. The semiconductor device according to claim 1, wherein the first conductive-type semiconductor region has a high-concentration impurity layer demonstrating a high concentration of impurities and a low-concentration impurity layer formed on the high-concentration impurity layer and demonstrating a low concentration of impurities.

4. The semiconductor device according to claim 3, wherein portions of the second conductive-type semiconductor region projecting into the first conductive-type semiconductor region are formed in such a manner as to contact the high-concentration impurity layer.

5. The semiconductor device according to claim 3, wherein portions of the second conductive-type semiconductor region projecting into the first conductive-type semiconductor region are formed in such a manner as to contact the high-concentration impurity layer and the low-concentration impurity layer.

6. The semiconductor device according to claim 4, wherein portions of the second conductive-type semiconductor regions projecting into the first conductive-type semiconductor region are formed in such a manner as to contact the high-concentration impurity layer and the low-concentration impurity layer.

7. A semiconductor device comprising:
   a first conductive-type semiconductor region having a first surface and a second surface opposite to the first surface, and made from a first conductive-type semiconductor material in which carriers are injected from a channel formed of a gate electrode solely on the first surface; and
   a second conductive-type semiconductor region made from a second conductive-type semiconductor material and formed in such a manner as to contact the second surface of the first conductive-type semiconductor region,
   wherein an average interface of a contact surface between the first and second conductive-type semiconductor regions is formed in such a manner as to form a predetermined angle with the channel, and the contact surface is formed in a convexo-concave shape.

8. The semiconductor device according to claim 7, wherein the contact surface is at least partially formed as a curved surface.

9. The semiconductor device according to claim 7, wherein the first conductive-type semiconductor region has a high-concentration impurity layer demonstrating a high concentration of impurities and a low-concentration impurity layer formed on the high-concentration impurity layer and demonstrating a low concentration of impurities.

10. The semiconductor device according to claim 9, wherein portions of the second conductive-type semiconductor regions projecting into the first conductive-type semiconductor region are formed in such a manner as to contact the high-concentration impurity layer.

11. A method of manufacturing a trench-gate-type semiconductor device comprising a first conductive-type semiconductor region having a first surface and a second surface opposite to the first surface, and made from a first conductive-type semiconductor material into which carriers are injected from a channel formed of a gate electrode formed in a trench solely on the first surface and a second conductive-type semiconductor region made from a second conductive-type semiconductor material and formed in such a manner as to contact the second surface of the first conductive-type semiconductor region, comprising:

a semiconductor area forming process in which the first conductive-type semiconductor region and/or the second conductive-type semiconductor region are/is formed such that a contact surface between the first and second conductive-type semiconductor regions assumes a convexo-concave shape.

12. The method according to claim 11, wherein the semiconductor region forming process includes an impurity implantation process in which impurities are selectively implanted in the second conductive-type semiconductor regions and a diffusion process in which the first conductive-type semiconductor region is formed in such a manner as to contact the second conductive-type semiconductor regions and the impurities are diffused into the first conductive-type semiconductor region.

13. The method according to claim 11, wherein the semiconductor region forming process includes a groove forming process in which grooves are formed in the second conductive-type semiconductor regions and a process in which the first conductive-type semiconductor region is formed in such a manner as to contact the second conductive-type semiconductor regions.

14. The method according to claim 11, wherein the semiconductor region forming process includes a process in which the first conductive-type semiconductor region is formed and a process in which impurities in the second conductive-type semiconductor region are diffused into the first conductive-type semiconductor region to form the second conductive-type semiconductor region.

* * * * *